(12) United States Patent
Hsieh et al.

(10) Patent No.: US 11,143,675 B2
(45) Date of Patent: Oct. 12, 2021

(54) INSULATOR APPLIED IN A PROBE BASE AND THE PROBE BASE

(71) Applicant: C.C.P. CONTACT PROBES CO., LTD., New Taipei (TW)

(72) Inventors: Chien-Yu Hsieh, New Taipei (TW); Yen-Chun Chen, New Taipei (TW); Chih-Hui Hou, New Taipei (TW); Wei-Chu Chen, New Taipei (TW); Yen-Hui Lu, New Taipei (TW); Ting-Chen Pan, New Taipei (TW); Yen-Wei Lin, New Taipei (TW); Bor-Chen Tsai, New Taipei (TW)

(73) Assignee: C.C.P. CONTACT PROBES CO., LTD., New Taipei (TW)

( * ) Notice: Subject to any disclaimer, the term of this patent is extended or adjusted under 35 U.S.C. 154(b) by 257 days.

(21) Appl. No.: 16/382,185

(22) Filed: Apr. 11, 2019

(65) Prior Publication Data

US 2019/0317129 A1 Oct. 17, 2019

(30) Foreign Application Priority Data

Apr. 13, 2018 (TW) .................................. 107112734

(51) Int. Cl.
*G01R 1/067* (2006.01)
*G01R 31/26* (2020.01)

(52) U.S. Cl.
CPC ..... *G01R 1/06761* (2013.01); *G01R 31/2601* (2013.01); *G01R 31/2644* (2013.01)

(58) Field of Classification Search
CPC ............ G01R 1/06705; G01R 1/06761; G01R 1/06772; G01R 1/07307; G01R 1/0735; G01R 31/2601; G01R 31/2644
See application file for complete search history.

(56) References Cited

U.S. PATENT DOCUMENTS

| 5,527,189 | A  | * | 6/1996 | Middlehurst | ........ | H05K 7/1084 |
|---|---|---|---|---|---|---|
|  |  |  |  |  |  | 439/607.14 |
| 6,798,229 | B2 | * | 9/2004 | Butler | ................ | G01R 1/06772 |
|  |  |  |  |  |  | 324/755.02 |
| 7,749,566 | B2 | * | 7/2010 | Staggert | ............. | G01R 1/07371 |
|  |  |  |  |  |  | 427/271 |
| 7,950,927 | B2 | * | 5/2011 | Kazama | ................... | G01R 3/00 |
|  |  |  |  |  |  | 439/66 |
| 2006/0066331 | A1 | * | 3/2006 | Yoshida | ............. | G01R 1/07314 |
|  |  |  |  |  |  | 324/756.03 |
| 2008/0088331 | A1 | * | 4/2008 | Yoshida | ............... | G01R 1/0466 |
|  |  |  |  |  |  | 324/755.05 |
| 2011/0050264 | A1 | * | 3/2011 | Kurosawa | .......... | G01R 1/07364 |
|  |  |  |  |  |  | 324/756.02 |

* cited by examiner

*Primary Examiner* — Thang X Le
(74) *Attorney, Agent, or Firm* — Fei-hung Yang

(57) ABSTRACT

An insulator applied in a probe base including a probe mounting hole, the insulator is a sheet structure having plural through holes, and the probe mounting hole is formed at the center of the insulator, and the probe mounting hole and the through hole penetrate from a first surface to a second surface of the insulator, and the regions of the first and second surfaces without the probe mounting hole and the through hole are coplanar. The probe base has a base body and at least a composite assembly, and the base body has at least a testing zone, and the composite assembly is installed in the testing zone and has at least a probe hole for installing a probe, and the insulator is installed into the probe hole.

9 Claims, 5 Drawing Sheets

INSULATOR APPLIED IN A PROBE BASE AND THE PROBE BASE

CROSS-REFERENCE TO RELATED APPLICATIONS

This non-provisional application claims priority under 35 U.S.C. § 119(a) on Patent Application No(s). 107112734 filed in Taiwan, R.O.C. on Apr. 13, 2018, the entire contents of which are hereby incorporated by reference.

FIELD OF INVENTION

The present invention relates to the field of electrical testing devices, in particular to an insulator applied in a probe base and the probe base is capable of applying to high bandwidth and lowering energy loss.

BACKGROUND OF INVENTION

1. Description of the Related Art

At present, it is necessary to test the electrical conditions of various precision microelectronics of electronic products before the electronic products are shipped out from factories, and this is one of the important steps of yield rate testing of the products. To facilitate the aforementioned testing for different electrical conditions of the products, probe is commonly used as a testing device for this purpose.

To expedite the testing of each electrical connection point of an electronic component, the test bases with several probes or connectors with several probes are introduced. In the testing, an end of the probe is contacted with an electrical connection point to form an electrical conduction, and the other end of the probe is electrically connected to a testing mechanism such as a circuit board, so that we can learn about the electrical conditions (such as the signal transmission) at each electrical connection point from the testing mechanism.

The present testing base or connector for testing electrical connection points generally require an insulator to isolate the probe from the testing base or connector to prevent short circuit or interference of the probe. When the test base and the connector are used for testing high-frequency signals, energy loss needs to be minimized to avoid signal transmission interference; meanwhile, the effect of noise shielding also needs to be considered to maximize testing efficiency. However, the conventional testing base and connector fail to minimize energy loss and fail to provide high measurement accuracy in high-frequency signals (GHz).

In view of the aforementioned drawbacks of the conventional probe, the inventor of the present invention based on years of experience in the related industries to conduct extensive research and experiment, and finally developed an insulator applied in a probe base and its probe base in accordance with the present invention to overcome the drawbacks of the prior art.

2. Summary of the Invention

Therefore, a primary objective of the present invention is to provide an insulator applied in a probe base and its probe base capable of reducing the signal reflection loss caused by impedance mismatch occurred during the testing process to improve the accuracy of the electrical testing significantly.

To achieve the aforementioned and other objectives, the present invention provides an insulator applied in a probe base having a probe mounting hole for passing a probe, characterized in that the insulator is a sheet structure and has a plurality of through holes, a first surface and a second surface, and the probe mounting hole is disposed at the center of the insulator, and the first surface and the second surface are configured to be opposite to each other, and the probe mounting hole and the through holes penetrate through the first surface to the second surface, and the regions of the first and second surfaces without the probe mounting hole or the through holes are coplanar. Therefore, the signal reflection loss caused by impedance mismatch can be reduced during the electrical transmission process of the probe; and better testing performance can be achieved.

In order to have good rigidity and impedance matching, another exemplary embodiment of the insulator discloses that the total area of the through holes falls within a range of 0.6 A-0.8 A, wherein A is the area of the region of the first surface without the probe mounting hole.

In a further exemplary embodiment, the through holes are arranged around the probe mounting hole, so that the air in the space of the insulator can be distributed uniformly.

In an exemplary embodiment, each through hole has a width decreasing from the first surface and the second surface towards the middle, so as to achieve a better effect of impedance matching performance.

The present invention also discloses a probe base for testing a semiconductor component, comprising: a base body, with at least a testing zone provided for placing the semiconductor component; at least a composite assembly installed in the testing zone, and having at least a probe hole for installing a probe; and at least an insulator, being a sheet structure installed in the probe hole having a probe mounting hole, a plurality of through holes, a first surface and a second surface, and the probe mounting hole being disposed at the center of the insulator, and the first surface and the second surface are configured to be opposite to each other, and the probe mounting hole and the through holes penetrating through the first surface to the second surface, and the regions of the first surface and the second surface without the probe mounting hole or the through holes are coplanar.

In another exemplary embodiment, the composite assembly comprises at least a metal module and at least a non-metal module, and the metal module and the non-metal module are assembled in a partial overlapped status. Therefore, the manufacturing cost of the probe base can be reduced, and the probe can meet the requirement of high-frequency testing.

Similarly, the region of the first surface without the probe mounting hole has an area A, and the total area of the through holes falls within a range of 0.6 A-0.8 A. Therefore, the insulator has good rigidity and impedance matching performance.

In a further exemplary embodiment, the through holes are arranged around the probe mounting hole, so that the volume of air in the space corresponding to the insulator can be distributed uniformly.

To facilitate a quick assembling process to form the composite assembly, the metal module has a first installing portion, and the non-metal module has a second installing portion, and the first installing portion and the second installing portion are corresponding to concave and convex structures respectively, and the first installing portion and the second installing portion are engaged with each other during assembling.

In addition, the surface of the composite assembly provided for installing the semiconductor component has a directing portion provided for placing the semiconductor component quickly and correctly.

In summation, the insulator applied in a probe base and the probe base thereof use a through hole structural design to reduce the signal reflection loss caused by impedance mismatch in the regions of the insulator in order to facilitate the testing process. The insulator of the present invention (regardless of being made of any material in compliance with the testing requirements) can use the structural design of the through hole to increase the impedance of the insulator for the need of high frequency transmission. The probe base adopting the insulator can improve the testing performance and precision, so that the probe base can be used in the field of testing high-frequency signals.

DESCRIPTION OF THE PREFERRED EMBODIMENTS

Figure 1:
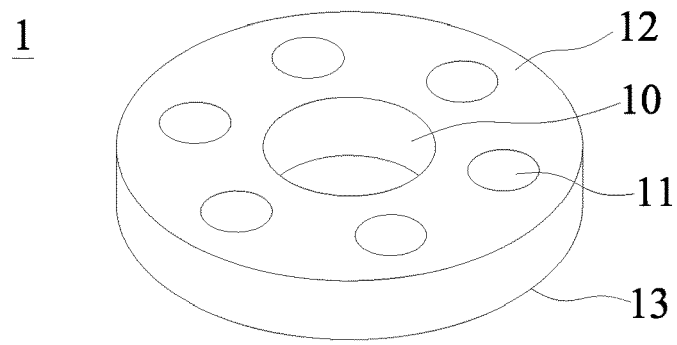
FIG. 1 is a perspective view of an insulator in accordance with a preferred embodiment of the present invention.

To make it easier for our examiner to understand the objective, technical characteristics, structure, innovative features, and performance of the invention, we use preferred embodiments together with the attached drawings for the detailed description of the invention. It is noteworthy that the embodiments are provided for the purpose of illustrating the invention but not intending for limiting the scope of the invention.

With reference to FIGS. 1, 2A, 2B and 3 for a perspective view and cross-sectional views and a schematic view of an insulator in accordance with a preferred embodiment of the present invention respectively, the insulator applied in a probe base 1 comprises a probe mounting hole 10 for passing and installing a probe. The insulator 1 is a sheet structure and has a plurality of through holes 11, a first surface 12 and a second surface 13, and the probe mounting hole 10 is formed at the center of the insulator 1, and the first surface 12 and the second surface 13 are configured to be opposite to each another, and the probe mounting hole 10 and the through holes 11 penetrate from the first surface 12 through the second surface 13, and the regions of the first surface 12 and the second surface 13 without the probe mounting hole 10 and the through holes 11 are coplanar, so that after the probe is passed through and installed in the probe mounting hole 10, the probe will not be tilted and the testing will not be affected by a tilted probe. Specifically, the insulator 1 is installed into a probe hole 211 of probe base for placing a probe, so that after the probe is passed through the probe mounting hole 10 and installed, the probe does not contact with the probe hole of the probe base directly to achieve the insulating and isolating effects. In the prior art, when the probe is used for high frequency (GHz) testing, the signal reflection loss is caused by impedance mismatch due to the high frequency transmission signal. In order to solve the shortcoming of the prior art, the insulator 1 of the present application is provided with through holes 11, so as to increase the impedance of the insulator 1 in the signal transmission process. By doing so, it facilitates the impedance matching with the tested object during high frequency signal testing, as well as lowers energy loss due to impedance mismatch and increases impedance matching capability during high frequency signal testing. Therefore, the present application is compatible to the 5G communication network which has a transmission frequency of 2.5 GHz-50 GHz.

Figure 6:
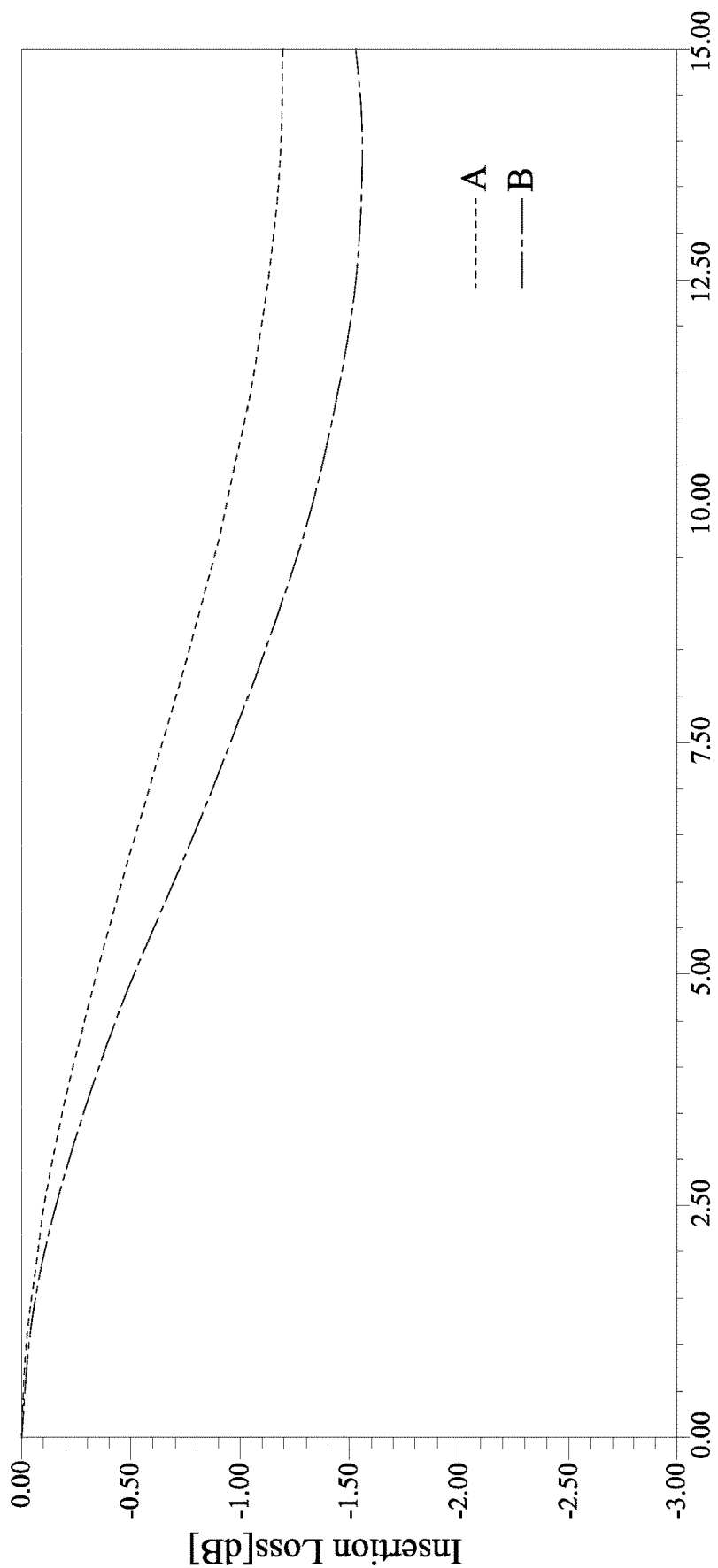
FIG. 6 demonstrates the insertion loss of an insulator without the through hole structure versus an insulator with the through hole structure in accordance with a preferred embodiment of the present invention.
Figure 7:
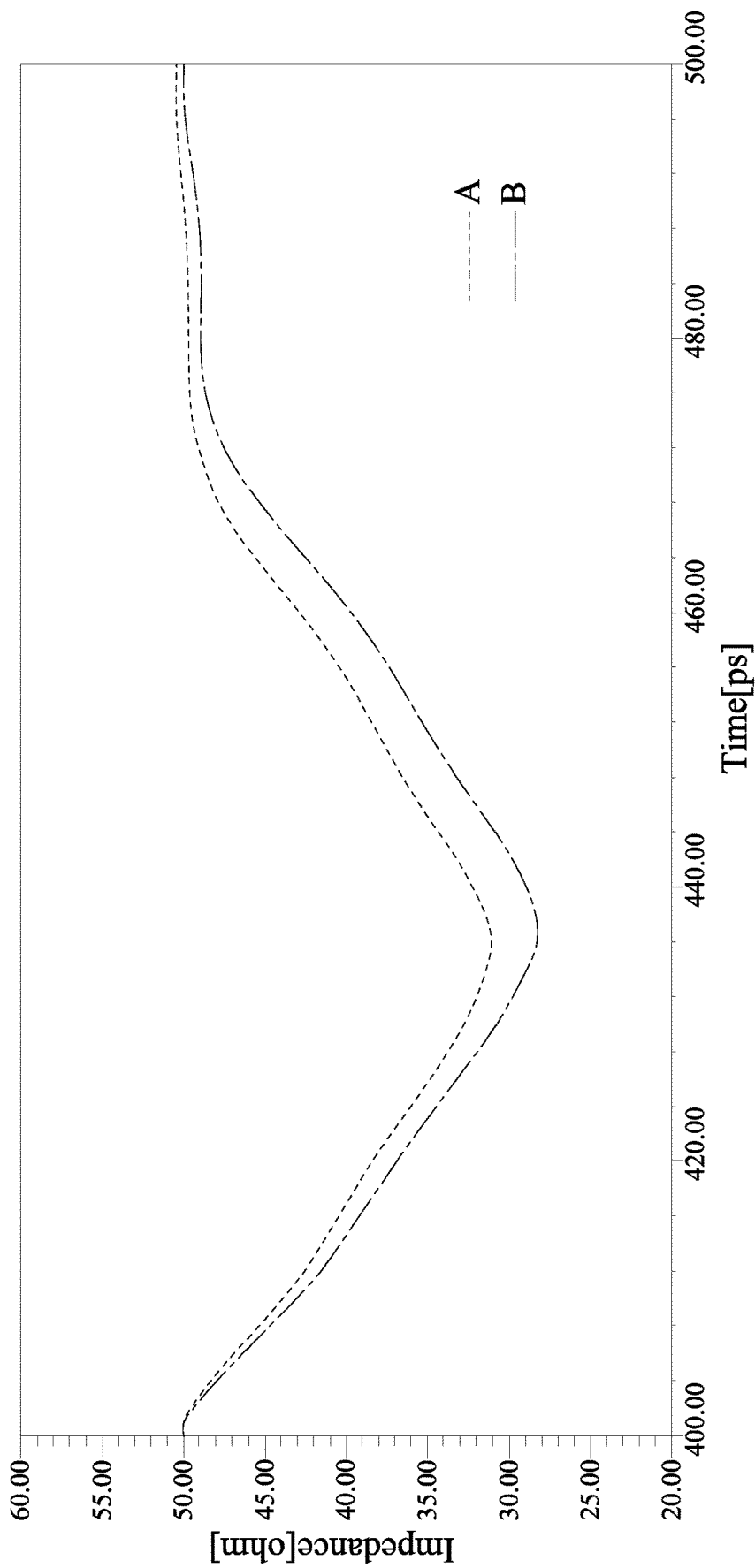
FIG. 7 demonstrates the impedance of an insulator without the through hole structure versus an insulator with the through hole structure in accordance with a preferred embodiment of the present invention.

Please refer to FIG. 6 and FIG. 7 for the comparison of insertion loss and impedance between an insulator 1 without the through hole 11 structure versus an insulator 1 with the through hole 11 during a high frequency testing process. FIG. 6 and FIG. 7 demonstrate that the insulator 1 with the through hole 11 can effectively reduce energy loss during a measurement caused by impedance mismatching. In both FIG. 6 and FIG. 7, the insulator 1 is provided with 4 through holes 11. Please refer to FIG. 6, curve A represents insertion loss of an insulator 1 with four through holes 11 under different testing frequencies; and curve B represents insertion loss of an insulator 1 without any through hole 11 under different testing frequencies. It is preferred to have insertion loss as close to 0 dB as possible. Take 15 GHz as an example, the insertion loss of the insulator 1 with four through holes 11 is −1.19 dB; on the other hand, the insertion loss of the insulator 1 without through hole 11 is about −1.52 dB. Evidently, the insulator 1 with four through holes 11 has a lower insertion loss relative to the insulator 1 without the through hole 11; in other words, providing through holes 11 on the insulator 1 can effectively reduce energy loss. Please refer to FIG. 7 for the comparison of impedance between an insulator 1 without the through hole 11 structure and an insulator 1 with the through hole 11 during a high frequency testing process; curve A represents the impedance of an insulator 1 with four through holes 11 under different testing frequencies; and curve B represents the impedance of an insulator 1 without any through hole 11 under different testing frequencies. As shown in FIG. 7, the impedance of the insulator 1 with four through holes 11 is higher than the impedance of an insulator 1 without any through hole 11. This implies that the impedance matching capability of insulator 1 with four through holes 11 is enhanced during high frequency testing while energy loss is reduced. As an example, the minimum impedance of the insulator 1 with four through holes 11 is 31 Ohm; on the other hand, the minimum impedance of the insulator 1 without through hole 11 is 28 Ohm.

Preferably, the total area of the through holes 11 falls within a range of 0.6 A-0.8 A wherein the area of the region of the first surface 12 without the probe mounting hole 10 is A. In other words, it is necessary to limit the quantity and size of the through holes 11, so that the total area of the through holes 11 is approximately equal to 60%-80% of the area of the region of the first surface 12 without the probe mounting hole 10. To take both rigidity and intensity of polarization exclusion of the insulator 1 into consideration, the total area of the through holes 11 should fall within the aforementioned range to prevent too many through holes 11 that may cause insufficient rigidity of the insulator 1. On the other hand, if the through holes 11 are too small or too few, the effect of the impedance adjustment will be lowered. In this exemplary embodiment, the total area of the through holes 11 is approximately equal to 0.7 A. Of course, the second surface 13 may have the same limitation at the same time.

Preferably, the through holes 11 are arranged around the probe mounting hole 10, so that the air remained in the through holes 11 can be distributed more uniformly to prevent the polarization from occurring mostly in certain regions of the insulator 1 or affecting the regulation effect. However, the present invention is not limited to aforementioned arrangement only, but the through holes 11 may be arranged at the insulator 1 in another way depending on the design requirements.

Figure 2A:
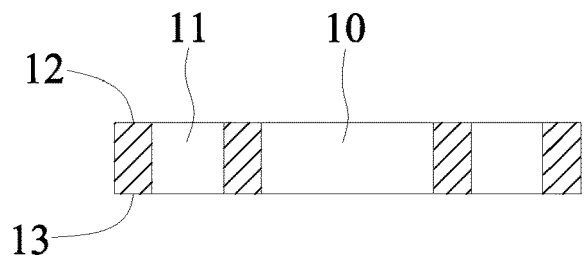
FIG. 2A is a cross-sectional view of an insulator in accordance with a preferred embodiment of the present invention.
Figure 2B:
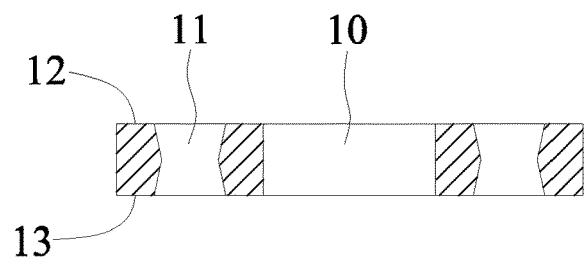
FIG. 2B is a cross-sectional view of an insulator in accordance with another implementation mode of a preferred embodiment of the present invention.
Figure 3:
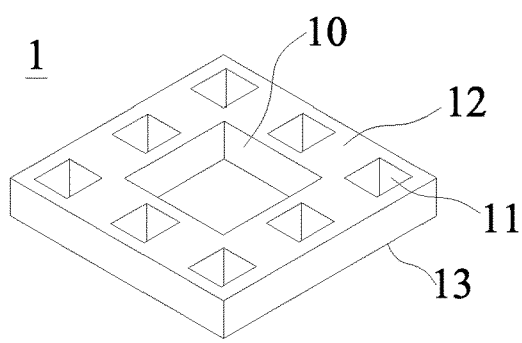
FIG. 3 is a schematic view of an insulator in accordance with another implementation mode of a preferred embodiment of the present invention.

In addition to the design of the through holes 11 having the same width as shown in FIGS. 1 and 2A, the insulator 1 may be designed with the through holes 11 of different widths as shown in FIG. 2B, wherein the width of each through hole 11 decreases from the first surface 12 and the second surface 13 towards the middle gradually to achieve a better effect of impedance adjustment efficiency. In addition to the insulator 1 as shown in FIG. 1 and the probe mounting hole 10 and the through holes 11 being in a circular shape, the insulator 1 may also be designed with a different shape depending to actual requirements, and the probe mounting hole 10 and the through holes 11 of the insulator 1 being in a rectangular shape as shown in FIG. 3. Of course, when the insulator 1 and the probe mounting hole 10 and the through holes 11 of the insulator 1 are rectangular, the width of the through holes 11 may be decreased gradually from the first surface 12 and the second surface 13 towards the middle.

Figure 4:
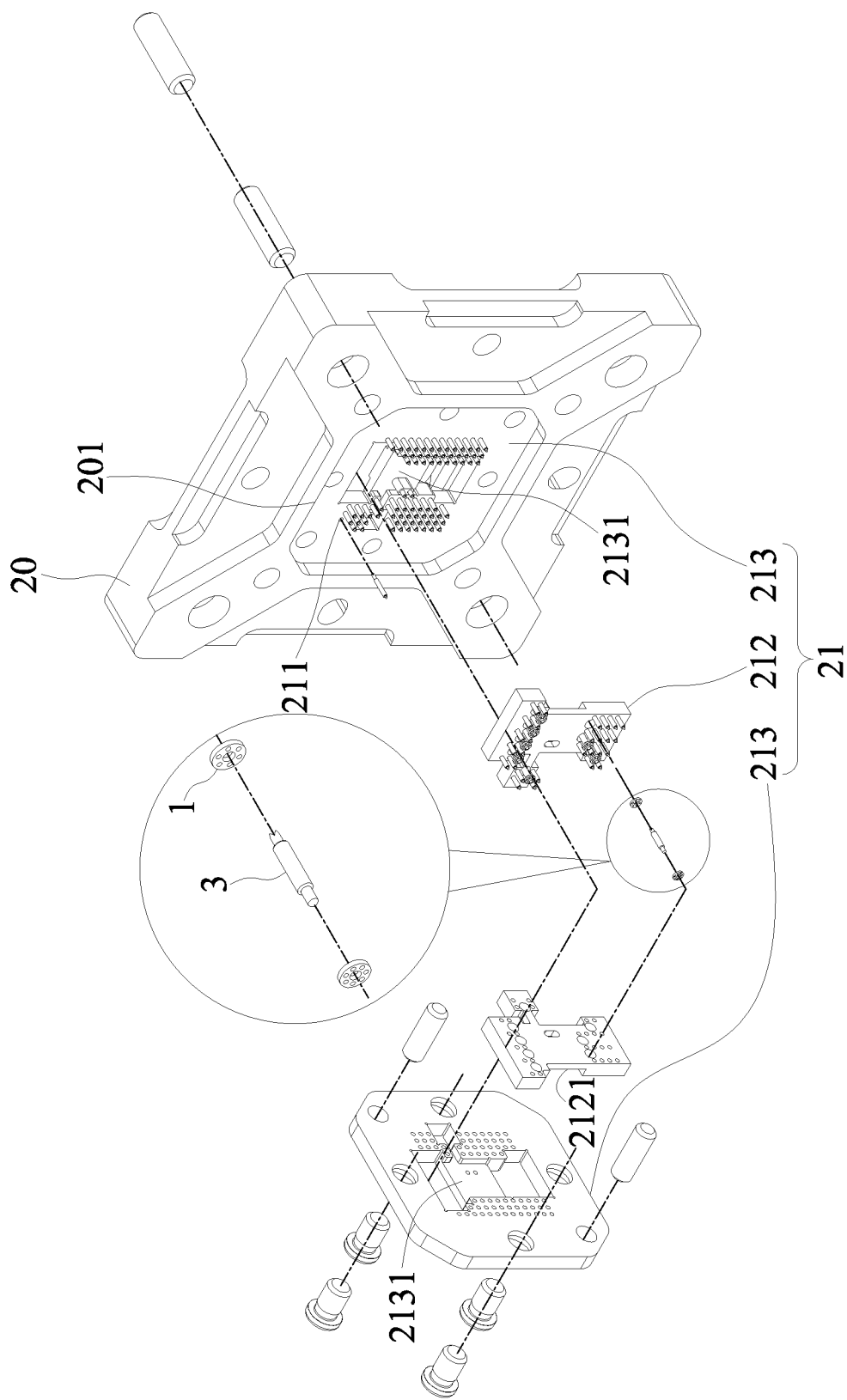
FIG. 4 is a perspective view of a probe base in accordance with a preferred embodiment of the present invention.
Figure 5:
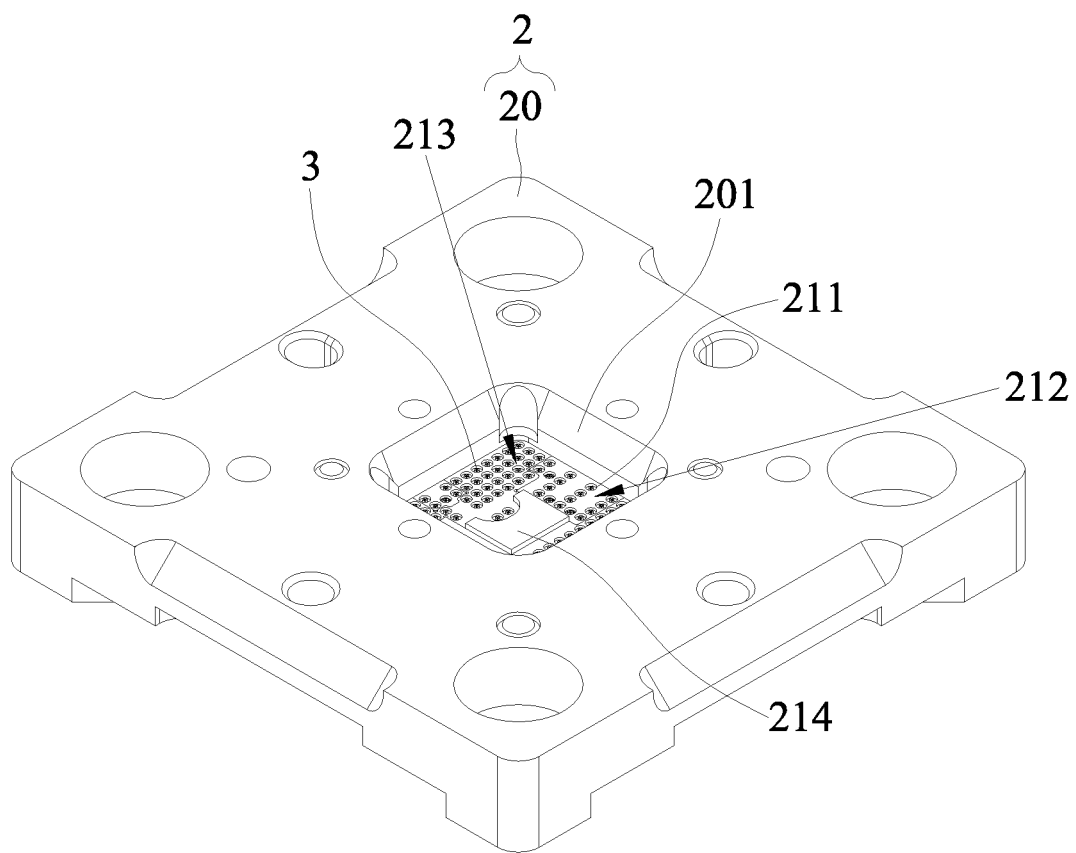
FIG. 5 is a schematic view of installing a probe base in accordance with a preferred embodiment of the present invention.

Please refer to FIGS. 4-7 for the following description. FIGS. 4 and 5 are exploded views and a schematic view of a probe base and FIGS. 1-3 for the detailed structure of the insulator in accordance with a preferred embodiment of the present invention respectively, the probe base 2 is provided for testing the electrical status of a semiconductor component. The probe base 2 comprises a base body 20, at least a composite assembly 21 and at least an insulator 1. The base body 20 has at least a testing zone 201 for placing the semiconductor component, and the composite assembly 21 is disposed in the testing zone 201 and has at least a probe hole 211 for installing a probe 3. The insulator 1 is installed in the probe holes 211, and the insulator 1 is a sheet structure and has a probe mounting hole 10, a plurality of through holes 11, a first surface 12 and a second surface 13, and the probe mounting hole 10 is formed at the center of the insulator 1, and the first surface 12 and the second surface 13 are configured to be opposite to each other, and the probe mounting hole 10 and the through holes 11 penetrate from the first surface 12 to the second surface 13, and the regions of the first surface 12 and the second surface 13 without the probe mounting hole 10 or the through holes 11 are coplanar. The composite assembly 21 is integrally or partially formed with the base body 20 or separated from the base body 20, and the details will be described later. The insulators 1 have the insulating and blocking effect to prevent short circuits. In addition, the through holes 11 of the insulators 1 are provided for effectively reducing the signal reflection loss caused by the impedance mismatch of the insulators 1 when the probe 3 transmits current or signals. Therefore, the probe 3 has a better transmission testing performance and can be applied in the area of high-frequency wideband signal testing. The technical characteristics and effects of the insulator 1 are the same as those described above. In this exemplary embodiment, the base body 20 has a testing zone 201, and the composite assembly 21 has the plurality of probe holes 211, and the insulators 1 are installed to the probe holes 211 as needed.

In view of the factors of the testing requirements and production costs, the composite assembly 21 of this exemplary embodiment comprises at least a metal module 212 and at least a non-metal module 213, and the metal module 212 and the non-metal module 213 are partially overlapped, so that the probe base 2 has both metal and non-metal heterostructures simultaneously. For example, when a high-frequency signal measurement is preformed, the function of filtering noises becomes very important. Once too many noises occur during the testing process, the testing result will be affected greatly. Now, a better choice is to use metal component to install the probe in order to obtain a better shielding effect. However, in actual practice of testing semiconductor components, the electrical connection points of the semiconductor components do not necessarily use a testing probe of the corresponding high-frequency testing specification for the testing, since the probe base made of a 100% metal material incurs a high cost and causes interference between the probes. To further enhance the testing effect of the probe base 2, this exemplary embodiment discloses the aforementioned structure, wherein the composite assembly used for installing the probes 3 comprises the metal module 212 and the non-metal module 213, so that the probes 3 can be used for testing the semiconductor component with a high-frequency transmission. For example, the probe holes 211 disposed at the metal module 212 are configured to be corresponsive to the positions of the high-frequency electrical connection points of the semiconductor component, and the probe holes 211 of the non-metal module 213 are configured to be corresponsive to the position of the non-high-frequency electrical connection points of the semiconductor component, respectively. In addition, the metal module 212 and the non-metal module 213 are partially overlapped, so that such design keeps the positions of the probe holes 211 to be separated from one another, or some of the probe holes 211 disposed at the metal module 212 and some of the probe holes 211 disposed at the non-metal module 213 are overlapped and communicated with each other. Either of the aforementioned arrangements can meet the shielding effect for high-frequency testing.

In this exemplary embodiment, the base body 20 is made of a non-metal material, and the composite assembly 21 and the base body 20 are partially integrally formed with each other. The composite assembly 21 includes two non-metal modules 213 and two metal modules 212, and one of the non-metal modules 213 is integrally formed at a position of the testing zone 201 corresponding to the base body 20, and the metal modules 212 and the other non-metal module 213 are installed sequentially in a bottom-side direction from the non-metal module 213 towards the base body 20, so as to form the composite assembly 21 in the testing zone 201.

Similarly, the total area of the through holes 11 falls within a range of 0.6 A-0.8 A where A is the area of the first surface 12 of the insulators 1 without the probe mounting hole 10, and such design can improve the functionality of the insulators 1. In addition, the through holes 11 are arranged around the probe mounting hole 10. The structural characteristics of the insulators 1 are substantially the same as described above, and thus will not be repeated.

In this exemplary embodiment, each metal module 212 has a first installing portion, and each non-metal module 213 has a second installing portion 2131, wherein the first installing portion 2121 and the second installing portion 2131 are corresponsive concave and convex structures respectively. During assembling, the first installing portion 2121 and the second installing portion 2131 are coupled with each other. In other words, if the first installing portion 2121 is a concave structure, the second installing portion 2131 is a convex structure embedded into the corresponding concave structure, and the connecting cross-sections are concave and convex with respect to each other. However, the present invention is not limited to this embodiment.

After the metal module 212 and the non-metal module 213 are coupled with each other, a locking element such as a screw is provided for improving the installability. Preferably, the surface of the composite assembly 21 provided for installing the semiconductor component is in a planar status, so as to have a better electrical connection status with the semiconductor component, or the surface of the composite assembly 21 for installing the semiconductor component has a directing portion 214 formed thereon and configured to be corresponsive to the semiconductor component depending on the design of the semiconductor component, so as to achieve the foolproof and directing functions, and the directing portion 214 may be a rib or groove structure.

In an application, the testing zone 201 is provided for placing a semiconductor component to be tested, and the probes 3 are electrically and respectively coupled to the electrical connection points of the semiconductor component, and the other end of the probes 3 is electrically coupled to a mechanism such as a circuit board for testing, and then the probes 3 can be used for testing the electrical property and status at each electrical connection point of the semiconductor component. In the testing process, the insulators 1 provide a better insulation effect by increasing the impedance value, so as to prevent signal reflection loss caused by impedance mismatch and improve the testing quality effectively.

In summation of the description above, the insulator applied in a probe base and its probe base of the present invention uses the aforementioned through hole structural design to increase the impedance value to achieve the effects of preventing the signal reflection loss caused by impedance mismatch to facilitate the high frequency testing process, particularly with frequency in the range of GHz. As a result, the present invention offers better testing efficacy and accuracy relative to the prior art. The insulator of the present invention, regardless of being made of any material in compliance with the testing requirements, can use the design of the through hole to achieve the effect of increasing the impedance value of the insulator. With the application of the probe base of the insulator, the testing performance and the testing precision can be improved, so that the probe can be applied to the area of testing high-frequency signals.

What is claimed is:

1. An insulator applied in a probe base, having a probe mounting hole for passing a probe, characterized in that:
    the insulator is a sheet structure and has a plurality of through holes, a first surface and a second surface, and the probe mounting hole is disposed at a center of the insulator, and the first surface and the second surface are configured to be opposite to each other, and the probe mounting hole and the through holes penetrate through the first surface to the second surface, and regions of the first and second surfaces without the probe mounting hole or the through holes are coplanar;
    wherein the through holes are arranged around the probe mounting hole;
    wherein each through hole has a width gradually decreasing from the first surface and the second surface towards the middle.

2. The insulator of claim 1, wherein the region of the first surface without the probe mounting hole has an area A, and the total area of the through holes falls within a range of 0.6 A-0.8 A.

3. A probe base, for testing a semiconductor component, comprising:
    a base body, with at least a testing zone provided for placing the semiconductor component;
    at least a composite assembly, installed in the testing zone, and having at least a probe hole for installing a probe; and
    at least an insulator, being a sheet structure installed in the probe hole, and having a probe mounting hole, a plurality of through holes, a first surface and a second surface, and the probe mounting hole being disposed at a center of the insulator, and the first surface and the second surface are configured to be opposite to each other, and the probe mounting hole and the through holes penetrating through the first surface to the second surface, and the regions of the first surface and the second surface without the probe mounting hole or the through holes being coplanar;
    wherein the composite assembly comprises at least a metal module and at least a non-metal module, and the metal module and the non-metal module are assembled in a partial overlapped status;
    wherein the metal module has a first installing portion, and the non-metal module has a second installing portion, and the first installing portion and the second installing portion are corresponding concave and convex structures respectively, and the first installing portion and the second installing portion are engaged with each other during assembling.

4. The probe base of claim 3, wherein the region of the first surface without the probe mounting hole has an area A, and the total area of the through holes falls within a range of 0.6 A-0.8 A.

5. The probe base of claim 4, wherein the through holes are arranged around the probe mounting hole.

6. The probe base of claim 4, wherein the surface of the composite assembly provided for installing the semiconductor component has a directing portion formed thereon and configured to be corresponsive to the semiconductor component depending on the design of the semiconductor component, so as to achieve the foolproof and directing functions.

7. The probe base of claim 3, wherein the region of the first surface without the probe mounting hole has an area A, and the total area of the through holes falls within a range of 0.6 A-0.8 A.

8. The probe base of claim 7, wherein the through holes are arranged around the probe mounting hole.

9. The probe base of claim 7, wherein the surface of the composite assembly provided for installing the semiconductor component has a directing portion formed thereon and configured to be corresponsive to the semiconductor component depending on the design of the semiconductor component, so as to achieve the foolproof and directing functions.

\* \* \* \* \*